(12) United States Patent
Arz

(10) Patent No.: US 6,882,547 B2
(45) Date of Patent: Apr. 19, 2005

(54) SHIELDED COMPARTMENT FOR A MAGNETIC RESONANCE APPARATUS

(75) Inventor: Winfried Arz, Erlangen (DE)

(73) Assignee: Siemens Aktiengesellschaft, München (DE)

(*) Notice: Subject to any disclaimer, the term of this patent is extended or adjusted under 35 U.S.C. 154(b) by 0 days.

(21) Appl. No.: 10/195,988

(22) Filed: Jul. 16, 2002

(65) Prior Publication Data

US 2003/0016518 A1 Jan. 23, 2003

(30) Foreign Application Priority Data

Jul. 16, 2001 (DE) ................................... 101 34 539

(51) Int. Cl.[7] .............................................. H05K 9/00
(52) U.S. Cl. .................... 361/816; 361/800; 361/818; 361/727; 174/35 R
(58) Field of Search ............................ 361/800, 816, 361/818, 727, 803, 752, 753; 174/35 R, 35 GC, 35.51 R

(56) References Cited

U.S. PATENT DOCUMENTS

| 4,646,046 A | 2/1987 | Vavrek et al. |
| 4,651,099 A | 3/1987 | Vinegar et al. |
| 4,713,277 A * | 12/1987 | Akiyama et al. ............ 428/131 |
| 4,755,630 A * | 7/1988 | Smith et al. ............ 174/35 MS |
| 4,954,781 A | 9/1990 | Hirata |
| 4,959,504 A * | 9/1990 | Yarger et al. ............ 174/35 MS |
| 5,847,316 A * | 12/1998 | Takada ................... 174/35 MS |
| 6,218,836 B1 | 4/2001 | Vrijheid |
| 6,233,158 B1 * | 5/2001 | Leman ....................... 361/799 |
| 6,255,823 B1 | 7/2001 | Carrozzi et al. |
| 6,320,123 B1 * | 11/2001 | Reimers ................ 174/35 MS |
| 6,437,993 B1 * | 8/2002 | Burgdorf et al. ............. 361/818 |

FOREIGN PATENT DOCUMENTS

DE 38 09 323 7/1992

OTHER PUBLICATIONS

Patent Abstracts of Japan Publication No. 2 001 036 282, and Translation of Japanese Application and 11206068.

* cited by examiner

Primary Examiner—David Zarneke
Assistant Examiner—Thanh Y. Tran
(74) Attorney, Agent, or Firm—Schiff Hardin LLP

(57) ABSTRACT

A shielded compartment for a magnetic resonance apparatus for shielding electromagnetic radio-frequency fields has at least one region that is formed of a foamed metal.

9 Claims, 3 Drawing Sheets

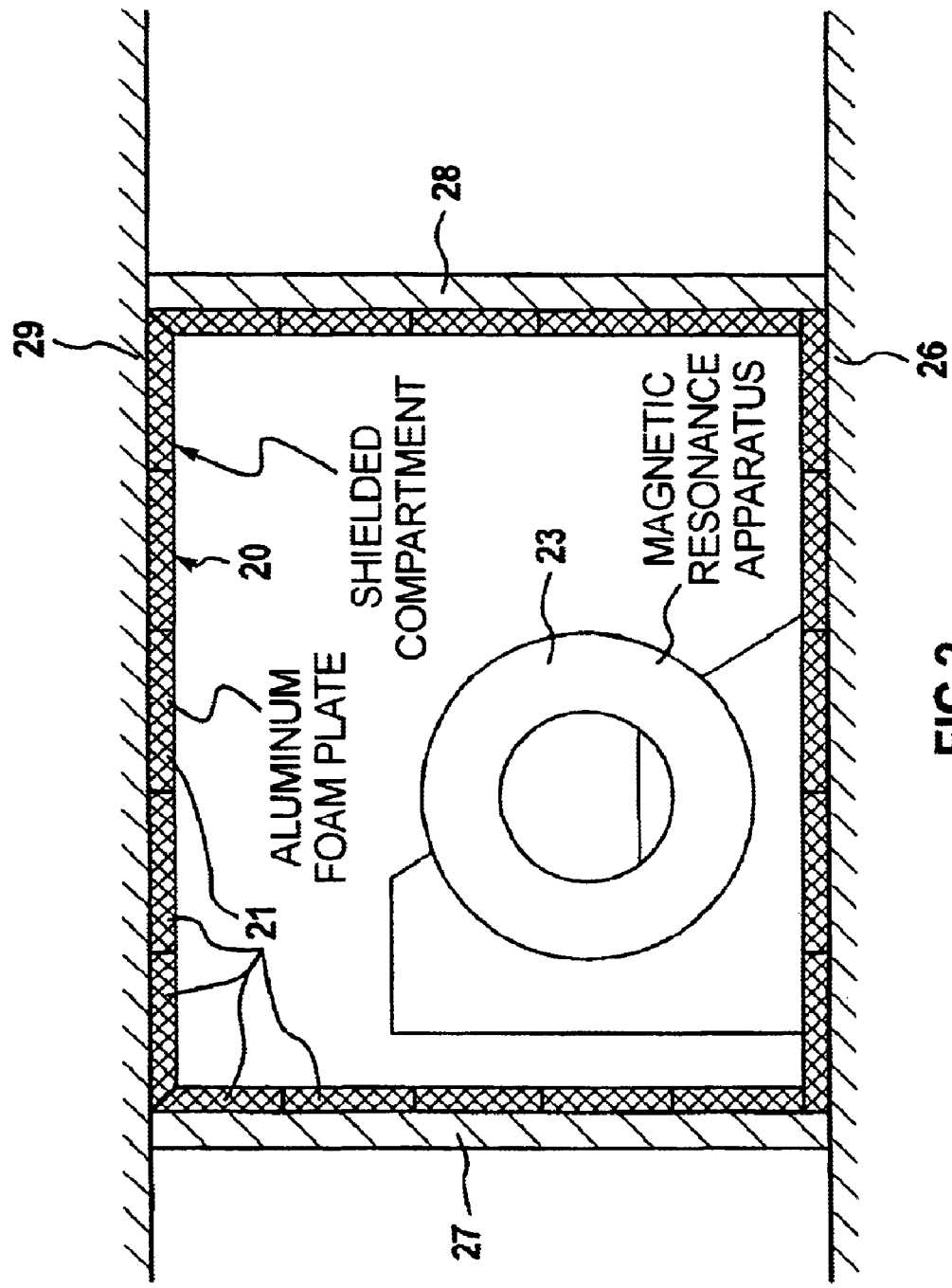

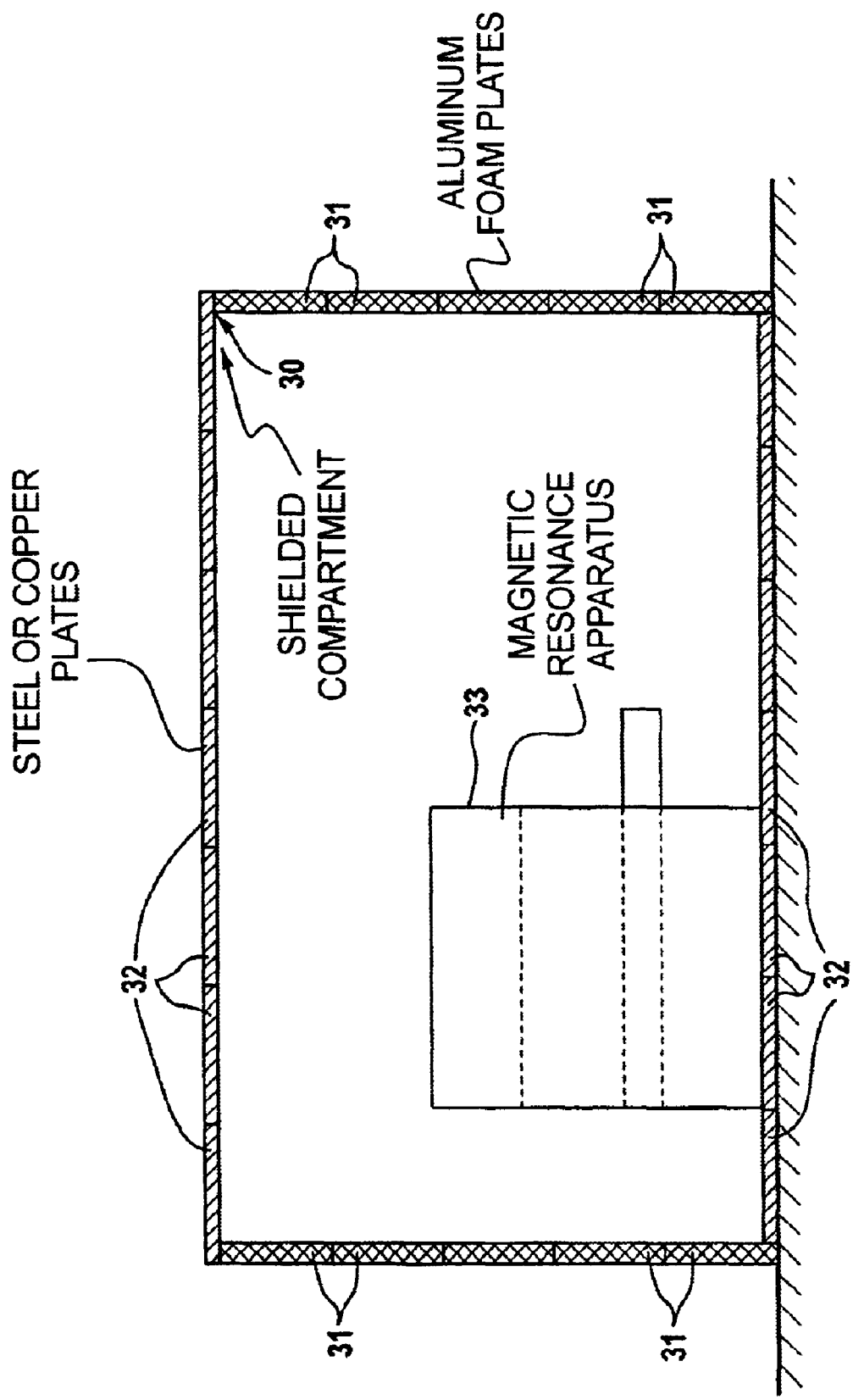

SHIELDED COMPARTMENT FOR A MAGNETIC RESONANCE APPARATUS

BACKGROUND OF THE INVENTION

1. Field of the Invention

The present invention is directed to a shielded compartment for a magnetic resonance apparatus for shielding electromagnetic radio-frequency fields.

2. Description of the Prior Art

Magnetic resonance technology is a known technique for acquiring images of the inside of the body of an examination subject. In a magnetic resonance apparatus, rapidly switched gradient fields that are generated by a gradient system are superimposed on a static basic magnetic field that is generated by a basic field magnet system. The magnetic resonance apparatus also has a radio-frequency system that emits radio-frequency signals into the examination subject for triggering magnetic resonance signals and picks up the magnetic resonance signals that are triggered, from which magnetic resonance images are produced.

Magnetic resonance signals are electromagnetic signals in the radio-frequency range. Their exact wave range is dependent on the strength of the basic magnetic field. So that the reception, and thus the magnetic resonance images, remain as uninfluenced as possible by external radio-frequency disturbances, it is standard in magnetic resonance technology to arrange at least the actual basic field magnet of the basic field magnet system, a gradient coil system of the gradient system and antennas of the radio-frequency system in a shielded compartment. The shielded compartment forms a gap-free envelope for the components of the magnetic resonance apparatus with an attenuation, for example, of at least 90 dB for a frequency range from 10 through 200 MHz and is—apart from windows—formed of a steel plate or a copper foil. The shielded compartment, of course, also develops its shielding effect in the opposite direction from inside to outside. U.S. Pat. No. 4,651,099 discloses an embodiment of a shielded compartment. The shielded compartment is fashioned of ferromagnetic metal for an additional shielding of, for example, the stray field of the basic field magnet toward the outside.

Since, for example, a gradient amplifier of the gradient system that supplies the gradient coil system and a control system of the radio-frequency system connected to the antennas are arranged outside the shielded compartment, corresponding connecting lines, for example between the gradient coil system and the gradient amplifier, are conducted via filters integrated into the shielded compartment, so that radio-frequency disturbances cannot proceed thereover into the shielded compartment. U.S. Pat. No. 6,218,836 discloses an embodiment of said filter.

For generating gradient fields, corresponding currents are set in gradient coils of the gradient system. The amplitudes of the required currents thereby amount to up to several 100 A. The current rise and decay rates can be up to several 100 kA/s. Given an existing basic magnetic field on the order of magnitude of 1 T, Lorentz forces that lead to mechanical oscillations of the gradient coil system act on these time-variable currents in the gradient coils. These oscillations are transmitted via various propagation paths onto the surface of the magnetic resonance apparatus. There, the mechanical oscillations are converted into acoustic oscillations that ultimately lead to unwanted noise.

A number of passive and active noise-reduction measures have been disclosed for magnetic resonance apparatuses. The known passive noise-reduction measures at a magnetic resonance apparatus include, for example, attachment of noise-damping foamed materials in cladding parts toward the gradient coil system and/or an arrangement of flexible layers at and/or in the gradient coil system. U.S. Pat. No. 4,954,781, for example, describes such measures.

It is also known to line an installation room of the magnetic resonance apparatus with soundproofing or sound-damping materials of, for example, mineral wool in order to at least damp a noise emission from the installation room toward the outside.

SUMMARY OF THE INVENTION

An object of the present invention is to provide an improved shielded compartment that exhibits a widespread shielding effect, among other things given a simple structure.

This object is inventively achieved in a shielded compartment for a magnetic resonance apparatus wherein at least one region of the shielded compartment is formed of a foamed metal for shielding electromagnetic radio-frequency fields.

Because the foamed metal, particularly an aluminum foam, is ultralight, can be manufactured in complicated shaped and is mechanically easy to process, simplifications can be achieved in the planning and installation. Aluminum foam, among other things shaped plate-like, is offered under the trademark ALULIGHT® by Alulight International GmbH in Ranshofen, Austria.

In an embodiment, the foamed metal is fashioned for shielding the electromagnetic radio-frequency fields as well as for shielding another quantity, for example sound and/or heat. With suitable fashioning, the foamed metal, particularly aluminum foam, exhibits properties that are capable of effectively attenuating electromagnetic radio-frequency fields as well as sound and/or heat. Compared to known shielded compartments of copper or steel plates that are additionally lined with soundproofing or sound-damping materials for shielding sound, the following advantages can be achieved: By eliminating additional soundproofing or sound-damping materials, a reduced outlay for materials as well as a simplified planning and installation are achieved. This in turn yields, among other things, a more economic cost. Given the same effectiveness, further, the shielding can be implemented with a thinner wall thickness.

In an embodiment, the region is selected such that the further quantity to be shielded can be effectively shielded in at least one direction. As a result, for example, a sound transmission from the inside of the shielded compartment can be damped direction-selectively by means of a specific wall of the compartment formed of the foamed metal, so that, for example, permitted noise limits can be satisfied in a residential area lying in the direction of the wall.

In another embodiment, the shielded compartment is fashioned to be self-supporting. Among the things thereby achieved is a high degree of independence from the installation environment, for example the implementation of masonry walls and/or the wall thickness of the installation room.

DESCRIPTION OF THE DRAWINGS

FIG. 2 shows a shielded compartment of aluminum foam as lining of an installation space in accordance with the invention.

FIG. 3 shows a self-supporting shielded compartment with walls of aluminum foam and floor and ceiling of copper or steel in accordance with the invention.

DESCRIPTION OF THE PREFERRED EMBODIMENTS

Figure 1:
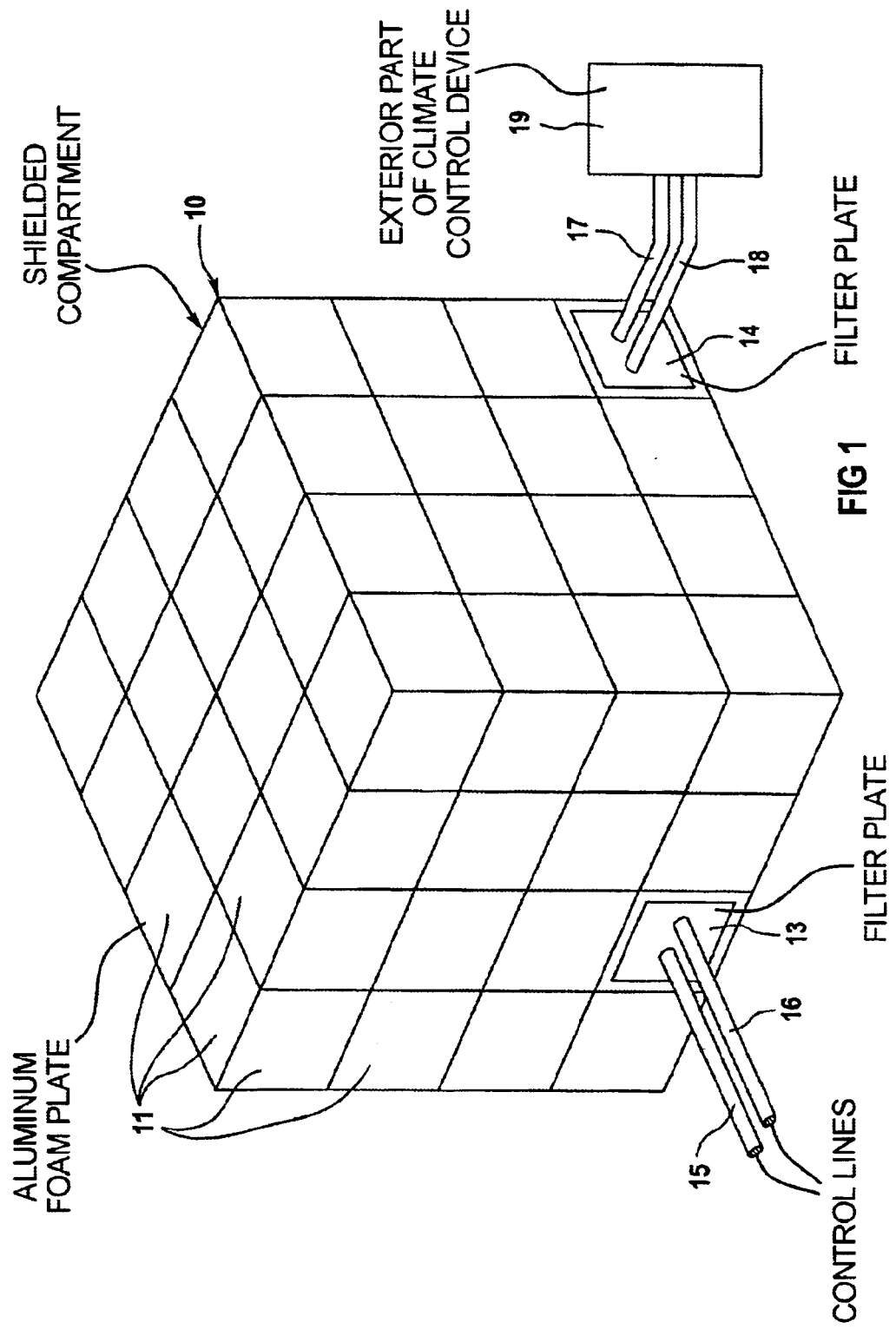
FIG. 1 shows a self-supporting shielded compartment composed of aluminum foam in accordance with the invention.

As an exemplary embodiment of the invention, FIG. 1 shows a perspective view of a self-supporting shielded compartment 10. The shielded compartment 10 is thereby composed of plates 11 of aluminum foam. The plates 11 are joined to one another in self-supporting fashion such that the shielded compartment 10 has a prescribable attenuation of, for example, 90 dB with respect to radio-frequency emission in a prescribable frequency range of, for example, 10 through 200 MHz. In another embodiment, the illustrated shielded compartment 10 has an additional skeleton to which the plates 11 of aluminum foam are correspondingly secured in order to achieve the self-supporting structure.

One of the plates 11 of aluminum foam surrounds a filter plate 13 for the passage of energy and control lines 15 and 16 that connect a gradient amplifier arranged outside the shielded compartment to a gradient coil system of a magnetic resonance apparatus arranged inside the shielded compartment. The filter plate 13 is thereby fashioned such that substantially no radio-frequency signals are transmitted via the energy and control lines 15 and 16 from the outside into the interior of the shielded compartment and, conversely, no radio-frequency are transmitted thereover from the interior toward the outside, at least in the prescribed frequency range.

Since the shielded compartment 10 composed of plates 11 of aluminum foam exhibits a good shielding effect not only in view of the radio-frequency emission in the prescribed frequency range but also has a good thermally insulating effect, the interior of the shielded compartment 10 can be climate-controlled in a simple way regardless of the space that surrounds it. To that end, the shielded compartment 10 has a further filter plate 14 through which the connecting lines 17 and 18 pass that connect a part of a climate-control device arranged inside the shielded compartment 10 to a part 19 of the climate-control device arranged outside the shielded compartment 10. The further filter plate 14 has properties corresponding to the filter plate 13.

Since, further, the shielded compartment 10 of plates 11 of aluminum foam exhibits a highly damping effect as to sound transmission between the exterior and the interior of the shielded compartment 10, noise transmission of the magnetic resonance apparatus arranged in the shielded compartment 10 toward the outside can be effectively damped with the illustrated shielded compartment 10.

As a further exemplary embodiment of the invention, FIG. 2 shows a cross-section through a shielded compartment 20 of plates 21 of aluminum foam that are secured to limiting surfaces of an installation space for a magnetic resonance apparatus 23. The plates 21 of aluminum foam of the shielded compartment 20 are an integral component part of the walls 27 and 28, of a ceiling 29 and of a floor 26 of the installation space. Compared to the shielded compartment 10 of FIG. 1, the shielded compartment 20 of FIG. 2 is not fashioned self-supporting. Otherwise, the above description for shielded compartment 10 applies analogously to the shielded compartment 20.

As a further exemplary embodiment of the invention, FIG. 3 shows a longitudinal section through a self-supporting shielded compartment 30 wherein only the walls of the shielded compartment 30 are formed of plates 31 of aluminum foam. A floor and a ceiling of the shielded compartment 30 are formed of steel or copper plates 32 of the type known in the art that effectively shield only a radio-frequency emission in the prescribed frequency range. In comparison thereto, the walls of plates 31 of aluminum foam develop their shielding effect not only with respect to the radio-frequency emission but also with respect to a noise emission of a magnetic resonance apparatus 33 operated in the shielded compartment 30. The noise emission of the magnetic resonance apparatus 33 is effectively damped in the horizontal direction. The above-described fashioning of a shielded compartment is especially advantageous when a quantity to be shielded is to be direction-selectively damped.

In a further embodiment a partial shielding, for example only one wall, of aluminum foam can be formed. As a result a transmission of sound and/or heat is effectively damped by the partial shielding, and the partial shielding need not be a component of a radio-frequency shielded compartment.

Although modifications and changes may be suggested by those skilled in the art, it is the intention of the inventor to embody within the patent warranted hereon all changes and modifications as reasonably and properly come within the scope of his contribution to the art.

What is claimed is:

1. A shielded compartment for a magnetic resonance apparatus comprising:

an enclosure having a floor and ceiling connected by walls having a size to contain a magnetic resonance examination apparatus therein, said enclosure having an interior and an exterior and shielding electromagnetic radio-frequency fields, associated with operation of said magnetic resonance examination apparatus, between said interior and said exterior; and said enclosure having at least one region formed of a foamed metal.

2. A shielded compartment as claimed in claim 1 wherein said foamed metal shields said radio-frequency fields.

3. A shielded compartment as claimed in claim 1 wherein said foamed metal, in addition to shielding said radio-frequency fields, shields propagation of a quantity between said interior and said exterior selected from the group consisting of sound and heat.

4. A shielded compartment as claimed in claim 3 wherein said at least one region is selected so that said propagation of said quantity is shielded in at least one direction between said interior and said exterior.

5. A shielded compartment as claimed in claim 1 wherein said foamed metal comprises an aluminum foam.

6. A shielded compartment as claimed in claim 1 wherein said foamed metal comprises a plurality of abutting plates of foamed metal connectable to each other.

7. A shielded compartment as claimed in claim 1 wherein said region comprises a surface of said enclosure selected from the group consisting at least one of said walls, said ceiling and said floor.

8. A shielded compartment as claimed in claim 1 wherein said enclosure is self-supporting.

9. A shielded compartment as claimed in claim 1 wherein said enclosure is climate-controlled.

\* \* \* \* \*